(12) United States Patent
Sanasi et al.

(10) Patent No.: US 10,553,297 B2
(45) Date of Patent: Feb. 4, 2020

(54) METHOD FOR CONTROLLING PROGRAM VERIFY OPERATIONS OF A NON-VOLATILE MEMORY AND A CORRESPONDING CIRCUIT THEREOF

(71) Applicant: SK hynix Inc., Gyeonggi-do (KR)

(72) Inventors: Alessandro Sanasi, Agrate Brianza (IT); Chiara Missiroli, Agrate Brianza (IT); Stefano Sivero, Agrate Brianza (IT)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/937,994

(22) Filed: Mar. 28, 2018

(65) Prior Publication Data
US 2018/0286488 A1    Oct. 4, 2018

(30) Foreign Application Priority Data

Mar. 29, 2017    (IT) ................. 10201734719

(51) Int. Cl.
| | | |
|---|---|---|
| *G11C 16/34* | (2006.01) | |
| *G11C 16/26* | (2006.01) | |
| *G11C 16/24* | (2006.01) | |
| *G11C 16/30* | (2006.01) | |
| *G11C 16/10* | (2006.01) | |
| *G11C 11/56* | (2006.01) | |
| *G11C 16/04* | (2006.01) | |

(52) U.S. Cl.
CPC ...... *G11C 16/3459* (2013.01); *G11C 11/5642* (2013.01); *G11C 16/10* (2013.01); *G11C 16/24* (2013.01); *G11C 16/26* (2013.01); *G11C 16/30* (2013.01); *G11C 11/5671* (2013.01); *G11C 16/0483* (2013.01); *G11C 2211/5621* (2013.01)

(58) Field of Classification Search
None
See application file for complete search history.

(56) References Cited

U.S. PATENT DOCUMENTS

| | | | |
|---|---|---|---|
| 2008/0247228 A1 | 10/2008 | Nguyen et al. | |
| 2010/0284226 A1* | 11/2010 | Noh ....................... | G11C 5/147 365/185.22 |
| 2017/0084347 A1* | 3/2017 | Kavalipurapu .... | G11C 16/3454 |

OTHER PUBLICATIONS

Extended Search Report Issued by Italian Patent office dated Nov. 16, 2017.

* cited by examiner

*Primary Examiner* — James G Norman
(74) *Attorney, Agent, or Firm* — IP & T Group LLP

(57) ABSTRACT

Provided herein may be a method for controlling program verify operations of a non-volatile memory and a corresponding circuit thereof. The method for controlling a program verify operation of a non-volatile memory, comprising: selecting a source line among source lines coupled to a plurality of planes respectively; measuring a voltage of the selected source line associated with target cells of the non-volatile memory to be verified in a first sensing operation; comparing the measured voltage of the selected source line with a reference voltage; and skipping the second sensing operation if the measured voltage of the selected source line is lower than the reference voltage.

17 Claims, 10 Drawing Sheets

METHOD FOR CONTROLLING PROGRAM VERIFY OPERATIONS OF A NON-VOLATILE MEMORY AND A CORRESPONDING CIRCUIT THEREOF

CROSS-REFERENCE TO RELATED APPLICATION

This application claims the benefit of Italian patent application No. 102017000034719 filed on Mar. 29, 2017 and which is incorporated herein by reference in its entirety.

BACKGROUND

1. Field

The present disclosure relates to a method for controlling program verify operations of a non-volatile memory, and a corresponding circuit for performing such a method.

2. Description of the Related Art

Among various types of semiconductor memory devices including flash memory devices, NAND-type flash memory devices are increasingly used as a high capacity data storage media. Each cell of a flash memory can be programmed to store information by trapping electrons in the cell. A control gate is connected to a wordline of the flash memory, and a voltage is provided to the control gate through the wordline. Each memory cell can store a single bit which is called a single level memory cell (SLC), or alternatively, each cell can store multiple bits which is called a multiple level memory cell (MLC). A memory cell storing three bits is particularly called a triple level memory cell (TLC). The information stored in each SLC, MLC, or TLC is defined by a corresponding threshold voltage of the memory cell.

To check whether a cell is correctly programmed, a program verify operation is performed following the program operation. The program verify operation may be performed, for example, by sensing the current flowing through a target cell, i.e., a cell that has been programmed, usually an entire wordline of target cells, with an expected threshold voltage applied to a selected wordline, i.e., a wordline connected to the target cell.

As the number of bits that one memory cell can store increases, more data can be stored in a given area, thereby the capacity of the memory can increase. However, since the number of threshold voltages of each cell doubles as 1 bit is added to the data bit, more precise control for programming or reading is required. For example, more precise control is required for a TLC or an MLC than an SLC.

To enhance the preciseness of the program verification, the program verify operation typically comprises many operational steps, namely many sensing operations, however this degrades the speed of the whole programming operation which includes the program verify operation. Therefore, an improved verify operation which strikes an improved balance between preciseness and programming speed would be desirable.

SUMMARY OF THE INVENTION

Embodiments of the invention are directed to a method for controlling a program verify operation of a non-volatile memory, and a corresponding circuit thereof.

An embodiment of the present disclosure may provide a method for controlling a program verify operation of a non-volatile memory. The method may include selecting a source line among source lines coupled to a plurality of planes respectively; measuring a voltage of the selected source line associated with target cells of the non-volatile memory to be verified in a first sensing operation; comparing the measured voltage of the selected source line with a reference voltage; and skipping a second sensing operation if the measured voltage of the selected source line is lower than the reference voltage.

An embodiment of the present disclosure may provide a circuit for controlling a program verify operation of a non-volatile memory, the program verify operation including a first sensing operation and a second sensing operation following the first sensing operation. The circuit may include a selection unit configured to select a source line among source lines coupled to a plurality of planes respectively; a comparator configured to compare a voltage of the selected source line associated with target cells of the non-volatile memory to be verified and a reference voltage, and to output the result of the comparison to a microcontroller of the non-volatile memory, wherein the second sensing operation is skipped if the voltage of the selected source line of the first sensing operation is lower than the reference voltage.

An embodiment of the present disclosure may provide a circuit for controlling a program verify operation of a non-volatile memory, the program verify operation including a first sensing operation and a second sensing operation following the first sensing operation. The circuit may include a selection unit configured to select a source line among source lines coupled to a plurality of planes respectively; a comparator configured to compare a voltage of the selected source line associated with target cells of the non-volatile memory to be verified and a reference voltage and to output the result of the comparison; and a microcontroller configured to store the result of the comparison and control the non-volatile memory to be selectively perform the first sensing operation and the second sensing operation in response to the result of the comparison.

BRIEF DESCRIPTION OF THE DRAWINGS

The characteristics and advantages of the disclosure will be apparent from the following description of embodiments thereof given by way of indicative and non-limiting examples with reference to the annexed drawings, in which.

DETAILED DESCRIPTION OF THE EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention. The terms and words used in the specification and claims should not be construed as their ordinary or dictionary sense. On the basis of the principle that the inventor can define the appropriate concept of a term in order to describe his/her own invention in the best way, it should be construed as a meaning and concepts for complying with the technical idea of the present invention. In addition, detailed descriptions of constructions well known in the art may be omitted to avoid unnecessarily obscuring the gist of the present invention.

In the drawings, corresponding features are identified by the same reference numerals.

It is noted that in some instances as it would be appreciated by those skilled in the art of the present invention a feature described in one embodiment may be used in another embodiment without departing from the scope of the present invention.

Figure 1:
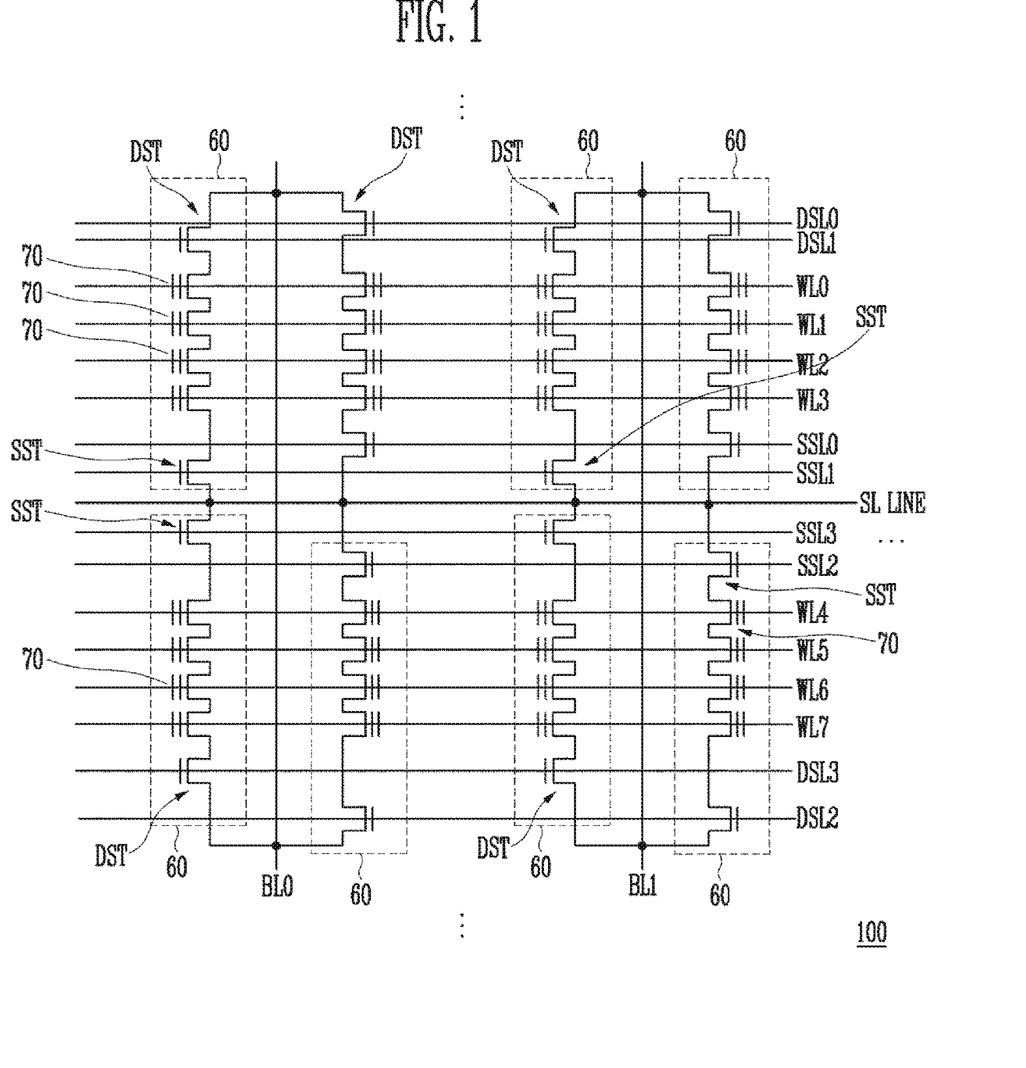
FIG. 1 shows an exemplary structure of respective strings and memory cells in the memory cell array of a NAND flash memory.

FIG. 1 shows an exemplary structure of respective strings and memory cells in a memory cell array of a NAND flash memory.

FIG. 1 shows eight strings 60 in a memory cell array 100. Each string 60 includes a plurality of memory cells 70 in which bit data is stored by programming, e.g., by trapping charges. One memory cell of the NAND flash memory is capable of storing 1 memory bit or several memory bits depending on its scheme. As already explained, based on the number of bits stored in each cell, the memory is called an SLC (single level cell), an MLC (multi-level cell) a TLC (triple level cell), etc.

In the example of FIG. 1, one string 60 includes four memory cells 70, but the number of the memory cells included in one string may vary depending on the implementation. Memory cells 70 are arranged at intersections of the plurality of bit-lines BL0, BL1 and the plurality of wordlines WL0~WL7, respectively. Strings can be selected or deselected by controlling a drain selection line, e.g. DSL0~DSL3, and by controlling a source selection line, e.g. SSL0~SSL3. Bit-lines BL0, BL1 of the memory cell array 100 are connected to a page buffer (700 of FIG. 7). Wordlines WL0~WL7, drain selection lines DSL0~DSL3 and source selection lines SSL0~SSL3 may be connected to, e.g. a row decoder (not shown).

Each of the drain selection lines DSL0~DSL3 is connected to a gate of a drain select transistor DST of each string 60. Each of the source selection lines SSL0~SSL3 is connected to a gate of a source select transistor SST of each string 60. The source select transistor SST connects each string to a conductive line as the source line SL, and can be switched. To make a specific string be connected with the bit-line, high voltage can be driven to the gate of the SST and DST transistors to switch them on. Due to the drain select transistor DST, the source select transistor SST, the source selection line SSL and the drain selection line DSL, specific strings belonging to a same row can be specifically addressed to carry out an operation such as a programming, or a read operation. The other strings which are not selected for the operation are de-coupled from the bit-lines by driving a low voltage to the gates of the DST and SST transistors of those strings.

Hereinafter, the embodiments will be explained in connection with the NAND flash memory shown in FIG. 1. However, the embodiments are not limited thereto, and can be also applied to different type of flash memories, e.g., a NOR flash memory.

As already indicated, to enhance the preciseness of the program verification, the program verify operation can comprise multiple steps of operations, namely sensing operations. For example, a program verify operation may include two sensing operations. The first sensing operation may be a rough reading with all BLs pre-charged, which causes a huge current to flow toward a source line SL LINE, whose voltage $V_{SL}$ rises accordingly. This is called as source bouncing. After the first sensing operation, the BLs of the cells having been read as erased are discharged and a recovery phase is executed to recharge the other BLs. Only then, a second sensing operation, in particular a more precise reading, can be performed with a lower current applied to the source line SL LINE which results in the source line being more correctly grounded, due to the fact that less cells are being sensed in the second sensing operation. The recovery phase of the second sensing operation is a time consuming operation. In order to reduce the whole programming time, the second sensing operation could be skipped.

Figure 2:
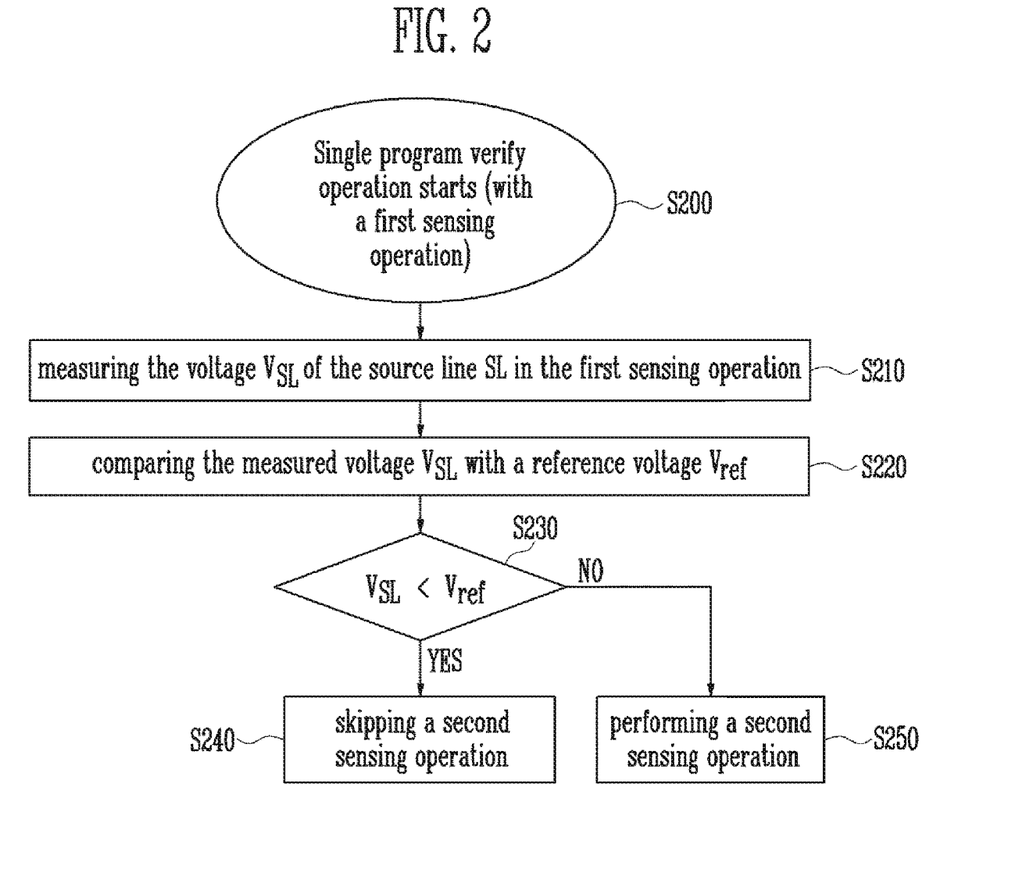
FIG. 2 shows a flow chart of a program verify operation in accordance with an embodiment.

FIG. 2 shows a flow chart of a program verify operation according to an embodiment. The first embodiment is referred to as a single program verify operation because it can skip the second sensing operation and the recovery phase of the second sensing operation as well when a preciseness condition is met after the performing of the first sensing operation. Hence, according to the single program verify operation a second verify operation is not performed at all times and may be skipped. The preciseness condition is selected to ensure that the preciseness of the program verify operation is adequate based only on the first sensing operation.

Referring to FIG. 2, at S200, the program verify operation starts with a first sensing operation. A second sensing operation may be skipped if it is determined that the first sensing operation is adequate.

In each of the first sensing operation and second sensing operation, the current flowing through target cells is sensed. Usually the target cells are all the cells of an entire wordline. The result of the current sensing operations is latched in a sensing latch in the page buffer in the first and second sensing operation. Usually, the result of the current sensing operations is in particular whether the current flowing through the target cells is higher than a specific current level or not, and the sensing latch stores a binary value indicating the result of such comparison so as to indicate whether the voltage applied to the gate of the target cells through the corresponding wordline is high enough to let a current greater than a specific value flow through it.

More in detail, the current flowing through each cell of a selected wordline is established by the amount of charge removed from a sensing node (SEN of FIG. 7) inside the page buffer in a predetermined amount of time. If the charge removed is high enough, the sensing node voltage becomes low and the cell is read as erased, otherwise the cell is read as programmed. All the cells of a selected wordline are read in parallel for each bitline and a different page buffer senses and stores the result of each reading operation.

At S210, the voltage $V_{SL}$ of the source line SL LINE is measured in the first sensing operation. The current as sensed by a corresponding current sensing circuit, e.g., the page buffer, is in fact discharged through the source line SL LINE during the first sensing operation. When excessive current is discharged through the cells to the source line SL LINE, high degree of source bouncing in the source line SL LINE can occur, e.g., as shown in the first period $T_1$ of FIG. 3A corresponding to the first sensing operation.

At S220, the voltage $V_{SL}$ of the source line SL LINE is compared with a reference voltage $V_{ref}$. If the voltage $V_{SL}$ of the source line SL LINE is lower than the reference voltage $V_{ref}$, the second sensing operation is skipped (step S240). In this case, the source bouncing is assumed to be tolerable such that the preciseness of the first sensing operation is acceptable. By skipping the second sensing operation, the whole program verify time can be advantageously reduced.

Meanwhile, if the voltage $V_{SL}$ of the source line SL LINE is not lower than the reference voltage $V_{ref}$, the second sensing operation is not skipped, but performed in step S250. In this case, the source bouncing is assumed to affect the preciseness of the first sensing operation, and for a more precise measurement, the second sensing operation is thus performed. Preferably, the bit-lines connected to the cells which have been determined as erased in the first sensing operation may be discharged before the second sensing operation, although the embodiment is not limited thereto.

Thanks to the method according to the first embodiment, a good balance between the preciseness and the speed of the program verify operation can be achieved.

Figure 3A:
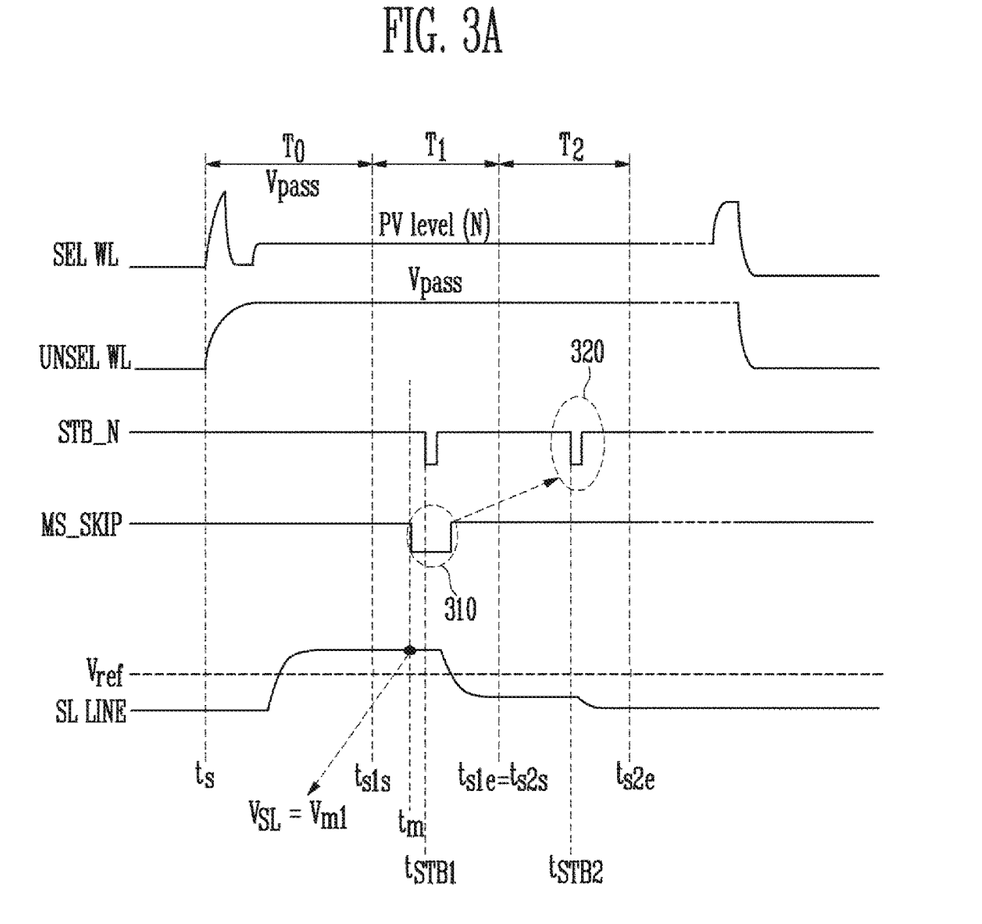
FIGS. 3A and 3B show timing diagrams of the program verify operation in accordance with an embodiment.

FIG. 3A shows an exemplary timing diagram of the program verify operation according to an embodiment. FIG. 3A depicts an example when the second sensing operation is performed, in particular at S250 of FIG. 2.

The program verify operation begins at a start time $t_s$. In a pre-charging period $T_0$, a bit-line pre-charging operation is performed. Bit-lines BLs of FIG. 1 are pre-charged during the pre-charging period $T_0$ by the page buffer connected to the bit-lines BLs. A PASS voltage $V_{pass}$ is thus driven to both of the selected wordline SEL WL and the unselected wordline UNSEL WL during the pre-charging period $T_0$. The PASS voltage $V_{pass}$ is a voltage at which memory cells connected to the given wordline are conductive irrelevant to their state or threshold voltage, i.e. whether the memory cells are erased or programmed. The page buffer (not shown) can charge the bit-lines BLs by the flowing current through the conduction path formed by the page buffer, the bit-line, the drain selector DST, the memory cell 70, the source selector SST, and the source line SL LINE 100. More particularly, rising the selected wordline to a pass voltage value avoids a particular kind of stress during such a charging operation. In other word, the capacitance between the bit-lines BLs and ground is charged during the pre-charging period $T_0$. By keeping the voltage of all bit-lines BLs stable during sensing, in particular, independently from the current sunk by the cells, interference between neighboring bit-lines BLs during the first sensing operation and/or the second sensing operation can be minimized.

The embodiment is not limited to the pre-charging operation as above described. Namely, the pre-charging period $T_0$ may be implemented in a different way without deviating from the scope of protection of the present invention. For example, the voltage of the selected wordline SEL WL may rise directly to a program verify voltage, during the pre-charging period $T_0$ as well.

A first sensing operation of the program verify operation is performed in the first period $T_1$ of FIG. 3A, starting from a start time $t_{s1s}$ and lasting till an end time $t_{s1e}$. The program verify voltage PV level (N) is applied to the selected wordline SEL WL. The program verify voltage PV level (N) is a function of an input N, which is associated with data programmed in a cell and is applied to a gate which is connected to the selected wordline SEL WL.

At a predetermined measurement time $t_m$, the voltage $V_{SL}$ of the relevant source line SL LINE is measured (step S210 of FIG. 2). A measured voltage, indicated as $V_{m1}$ in FIG. 3A, is compared with a reference voltage $V_{ref}$ (step S220 of FIG. 2). In FIG. 3A, the measured voltage $V_{m1}$ of the source line SL LINE ($V_{m1}=V_{SL}$) is greater than the reference voltage $V_{ref}$. Therefore, the second sensing operation is not skipped and performed (step S250 of FIG. 2).

More particularly, a circuit for performing the operation according to this first embodiment may output a skip signal MS_SKIP which is generated from a circuit suitable for comparing the measured voltage $V_{m1}$ and the reference voltage $V_{ref}$ and is provided to a microcontroller of the memory. In FIG. 3A, since the measured voltage $V_{m1}$ is greater than the reference voltage $V_{ref}$, the skip signal MS_SKIP is set as a first level, conventionally a low level.

According to this first embodiment, the microcontroller receives the skip signal MS_SKIP and in real time may skip or not skip the second sensing operation according to the level of the skip signal MS_SKIP. In particular, in the case depicted in FIG. 3A, the microcontroller receives a low voltage of the skip signal MS_SKIP and does not skip but performs the second sensing operation.

A strobe signal STB_N is a signal further inputted to the page buffer to indicate the time when the result of the sensing operation is latched in a corresponding sensing latch of the page buffer. In the first embodiment, the result of the sensing operation is latched when the strobe signal STB_N transits to a first level, conventionally a low level.

The predetermined measurement time $t_m$ at which the measurement of the voltage of the relevant source line SL LINE ($V_{SL}=V_{m1}$) is carried out may be at any point of time between the start time of the first sensing operation (indicated as $t_{s1s}$ in FIG. 3A) and the start time of the strobe operation, i.e., the transition to a low level of the strobe signal STB_N, indicated as $t_{STB1}$ in FIG. 3A.

When a determination is made that the second sensing operation should not be skipped, the second sensing operation is carried out in a second period $T_2$ starting at a starting time $t_{s2s}$ corresponding to the end time of the first sensing operation (indicated as $t_{s1e}=t_{s2s}$ in FIG. 3A) and lasting till an end time $t_{s2e}$. A further strobe operation is considered as a part of the second sensing operation and is also carried out as shown in a dashed circle 320 of FIG. 3A, starting from $t_{STB2}$, i.e., a further transition to a low level of the strobe signal STB_N, and is caused by the change of the skip signal MS_SKIP represented in a dashed circle 310 in FIG. 3A.

After the second period $T_2$, additional sensing operations of additional program verify operations with different voltages of the program verify voltage PV level (N+1) . . . of the selected wordline may be performed. Alternatively, the sensing operations may be terminated. The embodiment is not limited thereto.

Figure 3B:
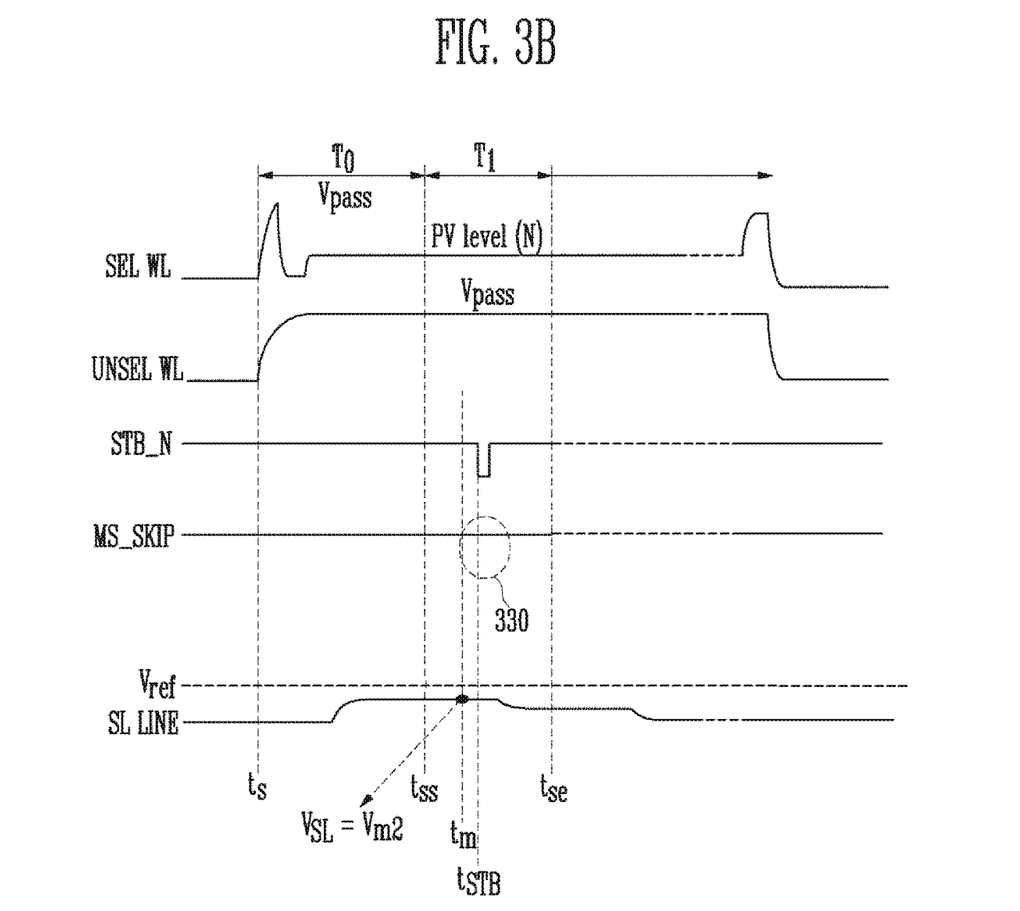

FIG. 3B shows an exemplary timing diagram of the program verify operation according to an embodiment. FIG. 3B depicts an example when the second sensing operation is skipped at S240 of FIG. 2.

The program verify operation begins at the start time $t_s$. In the pre-charging period $T_0$, a bit-line pre-charging operation may be performed, as previously described with reference to FIG. 3A.

The first sensing operation of the program verify operation is performed in the first period $T_1$ of FIG. 3B, starting from a start time $t_{ss}$ and lasting till an end time $t_{se}$. The program verify voltage PV level (N) is applied to the selected wordline SEL WL. As previously, the program verify voltage PV level (N) is a function of the input N, which is associated with data programmed in the cell.

At a predetermined measurement time $t_m$, the voltage $V_{SL}$ of the relevant source line SL LINE is measured (step S210 of FIG. 2). A measured voltage, indicated as $V_{m2}$ in FIG. 3B, is compared with the reference voltage $V_{ref}$ (step S220 of FIG. 2). The measured voltage $V_{m2}$ of the source line SL LINE ($V_{m2}=V_{SL}$) is not greater than the reference voltage $V_{ref}$. Therefore, the second sensing operation is skipped (step S240 of FIG. 2).

The circuit for performing the operation according to this first embodiment may thus output the skip signal MS_SKIP which is generated from the suitable circuit comparing the measured voltage $V_{m2}$ and the reference voltage $V_{ref}$ and is provided to the microcontroller of the memory. In FIG. 3B, since the measured voltage $V_{m2}$ is not greater than the reference voltage $V_{ref}$, the skip signal MS_SKIP is maintained at a second level, conventionally a high level.

As previously, the microcontroller receives the skip signal MS_SKIP and in real time skips the second sensing operation.

The strobe signal STB_N is the signal inputted to the page buffer to indicate the time when the result of the sensing operation is latched in a corresponding sensing latch of the page buffer. In the first embodiment, the result of the sensing operation is latched when the strobe signal STB_N transits to a first level, conventionally a low level.

The predetermined measurement time $t_m$ at which the measurement of the voltage $V_{SL}$ of the relevant source line SL LINE ($V_{SL}=V_{m2}$) is carried out may be at any point of time between the start time of the first sensing operation (indicated as $t_{ss}$ in FIG. 3B) and the start time of the strobe operation, i.e., the transition to a low level of the strobe signal STB_N, indicated as $t_{STB}$ in FIG. 3B.

When it is determined that the second sensing operation is skipped, the second sensing operation is not carried out following the first sensing period $T_1$. There is no change of the skip signal MS_SKIP, in particular in a period indicated in a dashed circle 330 in FIG. 3B, which signals that the second sensing operation shall be skipped.

After the first period $T_1$, additional sensing operations of additional program verify operations with different voltages of the program verify voltage PV level (N+1) . . . of the selected wordline SEL WL may be performed. Alternatively, the sensing operations may be terminated. The embodiment is not limited thereto.

Suitably, the reference voltage $V_{ref}$ may be set differently for each program verify voltage.

Figure 4:
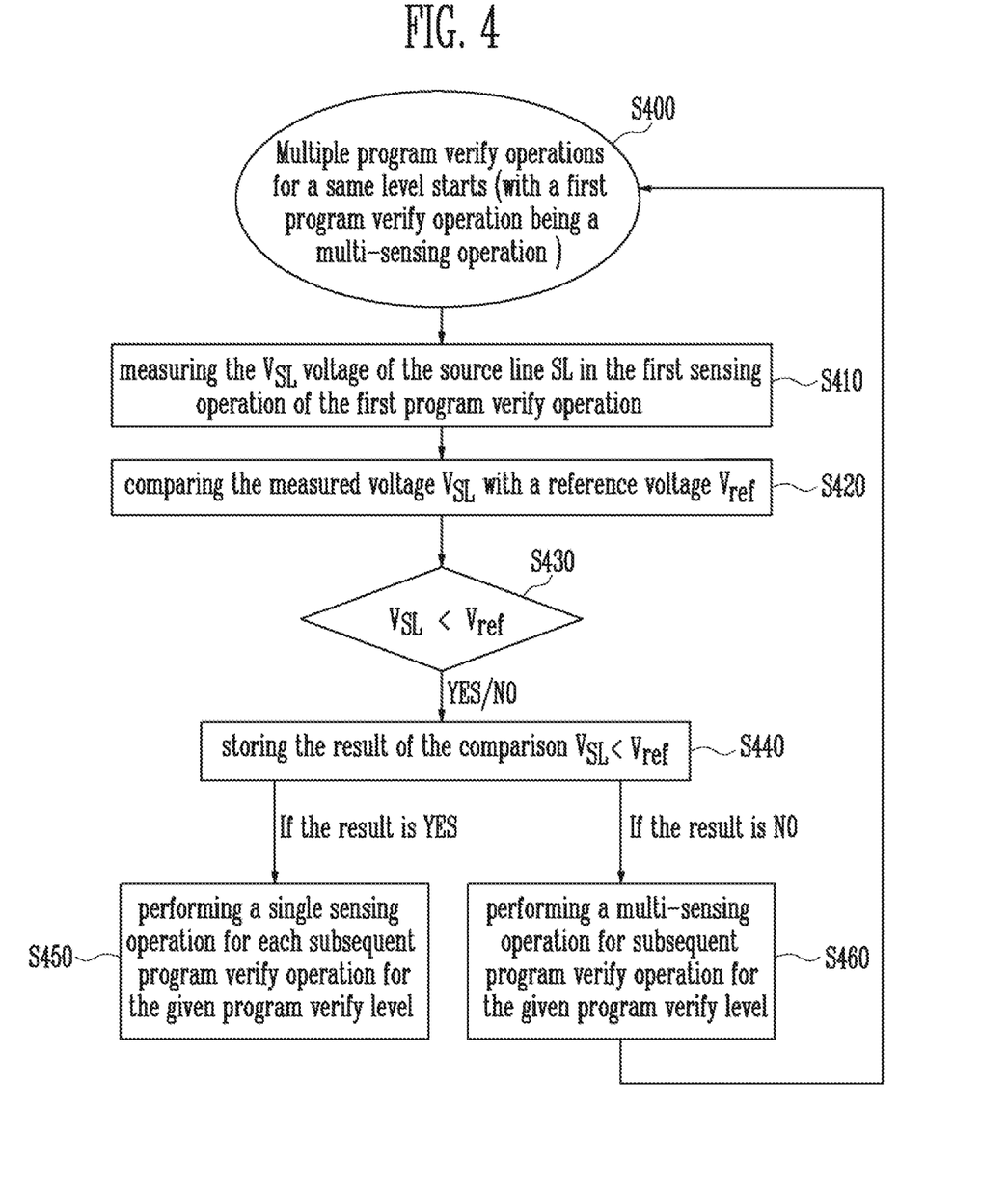
FIG. 4 shows a flow chart of a program verify operation in accordance with an embodiment.

FIG. 4 shows a flow chart of a program verify operation according to an embodiment. The second embodiment provides a program verify operation comprising multiple program verify operations for a same program verify voltage, namely a first program verify operation and at least a subsequent program verify operation for each program verify voltage, and the method to control thereof, by skipping when possible the first sensing operation in each subsequent program verify operation, on the basis of a suitably stored result of a comparison of the voltage of the source line and a reference voltage made in a first sensing operation of the first program verify operation.

In particular, the first program verify operation is a multi-sensing operation comprising at least two steps:

a first sensing operation, performed by using a high current level in order to exclude deeply erased memory cells, and a second sensing operation, performed with the target cells current level.

At S410, the program verify operation starts with a first program verify operation. As indicated, the first program verify operation of the second embodiment is a multi-sensing operation and comprises a first sensing operation and a second sensing operation following the first one, as described in the first embodiment. Each subsequent program verify operation of the second embodiment can be a single sensing operation or a multi-sensing operation. A single sensing operation comprises only one sensing operation, performed with a target cells current level, as a second sensing operation of a multi-sensing operation.

Figure 5A:
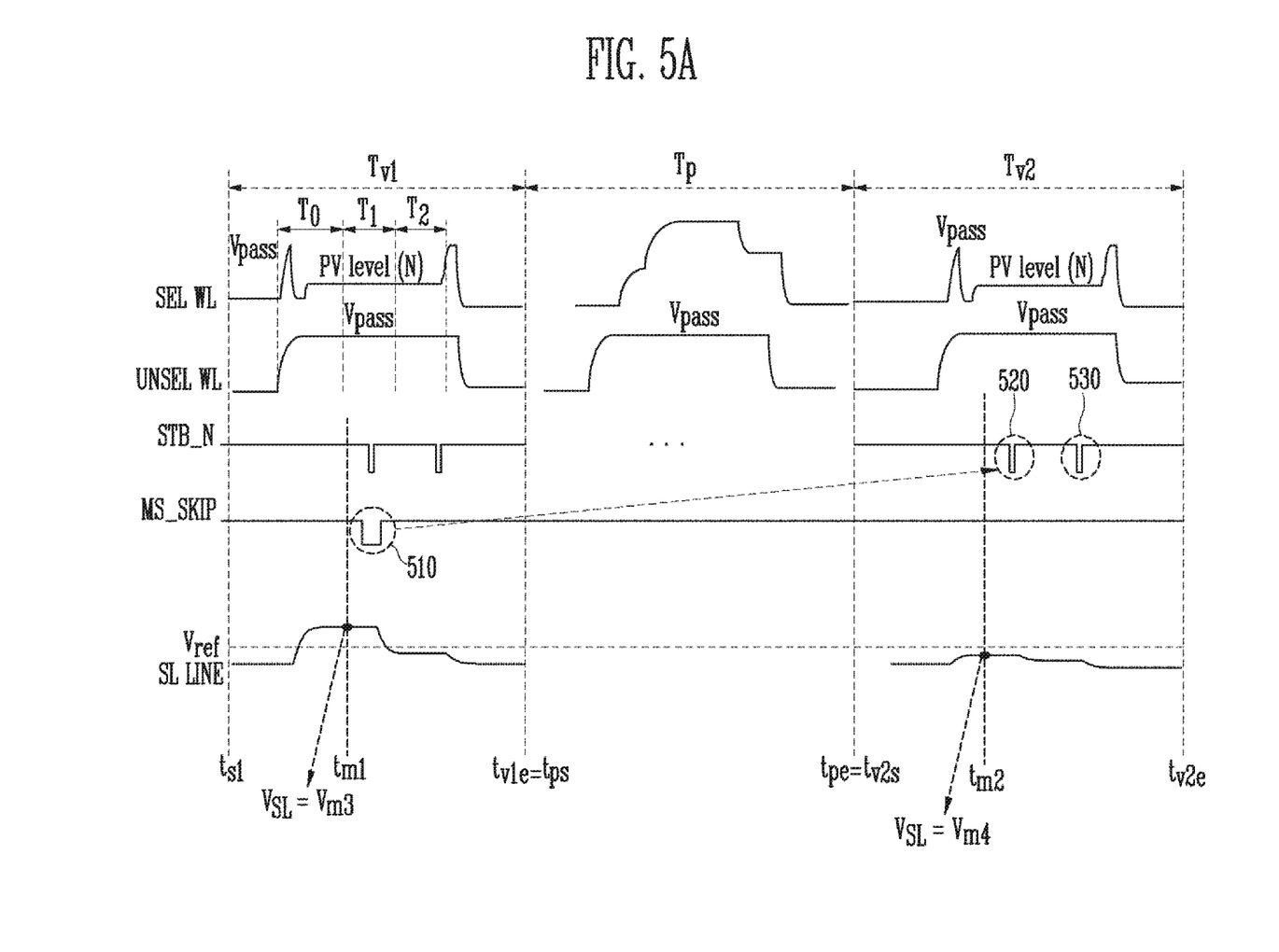
FIGS. 5A-5C show timing diagrams of the program verify operation in accordance with an embodiment.

At S410, the voltage $V_{SL}$ of the source line SL LINE is measured in the first sensing operation of the first program verify operation. The current as sensed by a corresponding current sensing circuit, e.g. the page buffer, is discharged through the source line SL LINE during the first sensing operation of the first program verify operation. When excessive current is discharged through the cells to the source line SL, a high degree of source bouncing in the source line SL LINE can occur, e.g., as shown in the first period $T_{v1}$, of the first program verify operation, as indicated in FIG. 5A.

At S420, the measured voltage $V_{SL}$ of the source line SL LINE is compared with a reference voltage $V_{ref}$. The result of the comparison at step S430 is stored in the microcontroller of the memory for each program verify voltage, corresponding to a different program verify voltage applied to the selected wordline SEL WL (step 440).

In particular, according to the second embodiment, if the voltage $V_{SL}$ of the source line SL LINE as measured in the first sensing operation of the first program verify operation is lower than the reference voltage $V_{ref}$, a single sensing operation is performed as any subsequent program verify operations for a given program verify voltage (step S450 of FIG. 4). In this case, the source bouncing is assumed to be tolerable such that the preciseness of a single sensing operation is sufficient to reach the target preciseness for that given program verify voltage. By performing a single sensing operation as subsequent program verify operations, the whole program verify time can be reduced for that given program verify voltage.

Meanwhile, if the voltage $V_{SL}$ of the source line SL LINE as measured in the first sensing operation of the first program verify operation is not lower than the reference voltage $V_{ref}$, a multi-sensing operation is performed as subsequent program verify operations for a given program verify voltage. In this case, source bouncing is assumed to affect the preciseness of the first sensing operation for the given program verify voltage, and for more precise measurement, a multi-sensing operation is performed for the given program verify voltage.

According to the method of the second embodiment, a good balance between the preciseness and the speed of the program verify operation can be also achieved.

FIG. 5A shows an exemplary timing diagram of the program verify operation according to an embodiment. FIG. 5A depicts an example when a multi-sensing operation is performed as a subsequent program verify operation at S460 of FIG. 4.

A first program verify operation begins at $t_{s1}$, and lasts a first period $T_{v1}$ till the end time $t_{v1e}$ as indicated in FIG. 5A. In FIG. 5A, the first program verify operation is a multi-sensing operation, comprising first and second sensing operations and lasting a period $T_{v1}$ equal to the sum of the first and second sensing operations periods, $T_1$ and $T_2$, as for the first embodiment shown in FIG. 3A. For sake of simplicity, explanations of corresponding features with respect to the first embodiment are omitted in the following description of the second embodiment.

As previously explained, the first program verify operation may comprise a pre-charging period $T_0$, a first sensing period $T_1$ and a second sensing period $T_2$ within the period $T_{v1}$ of such a first program verify operation.

The first sensing operation of the first program verify operation is performed in the first period $T_1$. The program verify voltage PV level (N) is applied to the selected wordline SEL WL. The program verify voltage PV level (N) is a function of the input N, which is associated with data programmed in the cell.

At a predetermined measurement time $t_{m1}$, the voltage $V_{SL}$ of the relevant source line SL LINE is measured (step S410 of FIG. 4) in the first program verify operation. A measured voltage, indicated as $V_{m3}$, is compared with the reference voltage $V_{ref}$ (step S420 of FIG. 4). In FIG. 5A, the measured voltage $V_{m3}$ of the source line SL LINE is greater than the reference voltage $V_{ref}$. Therefore, a subsequent program verify operation performed in a subsequent period $T_{v2}$ is chosen as a multi-sensing operation (step S460 of FIG. 4).

Figure 5B:
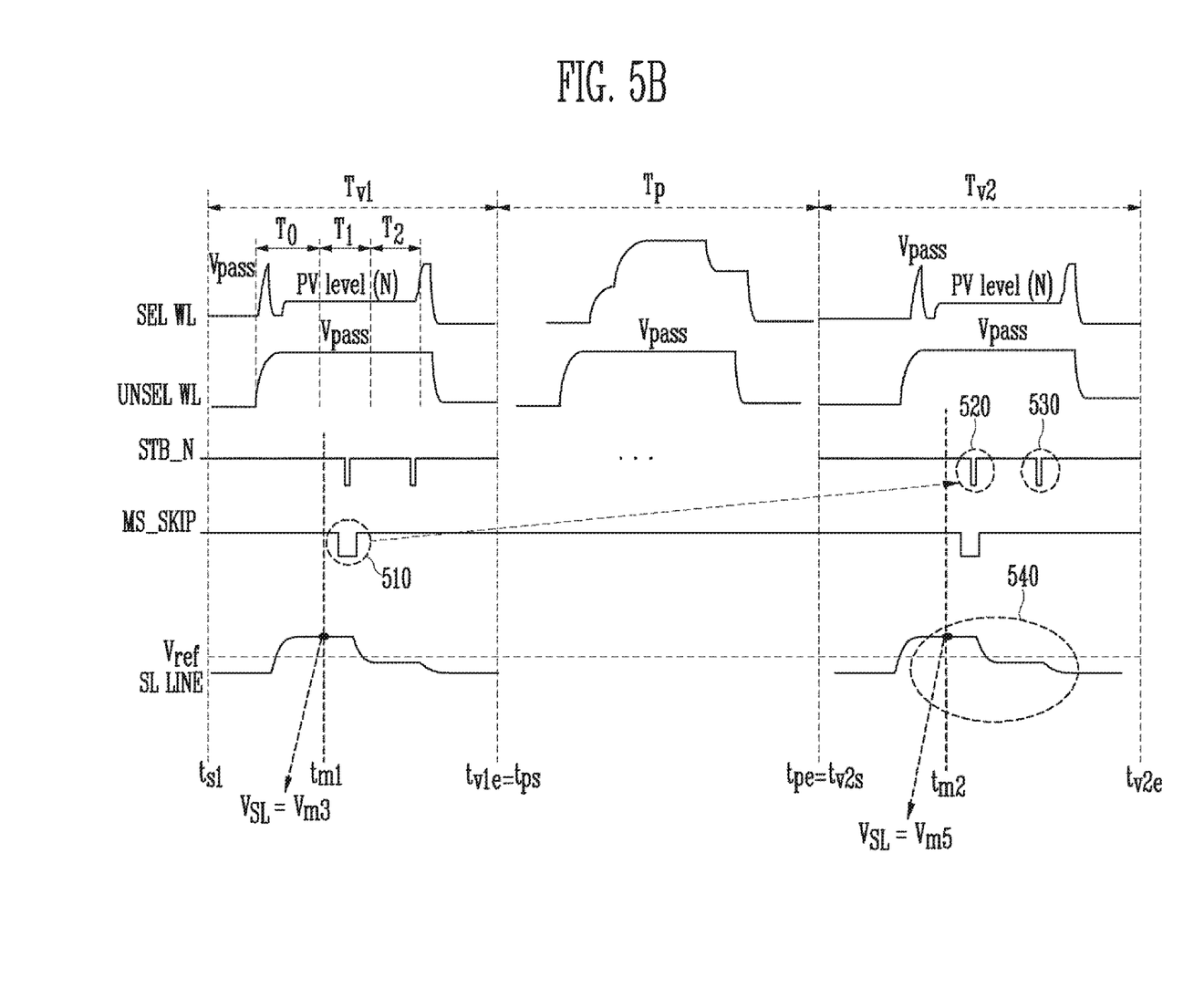
Figure 5C:
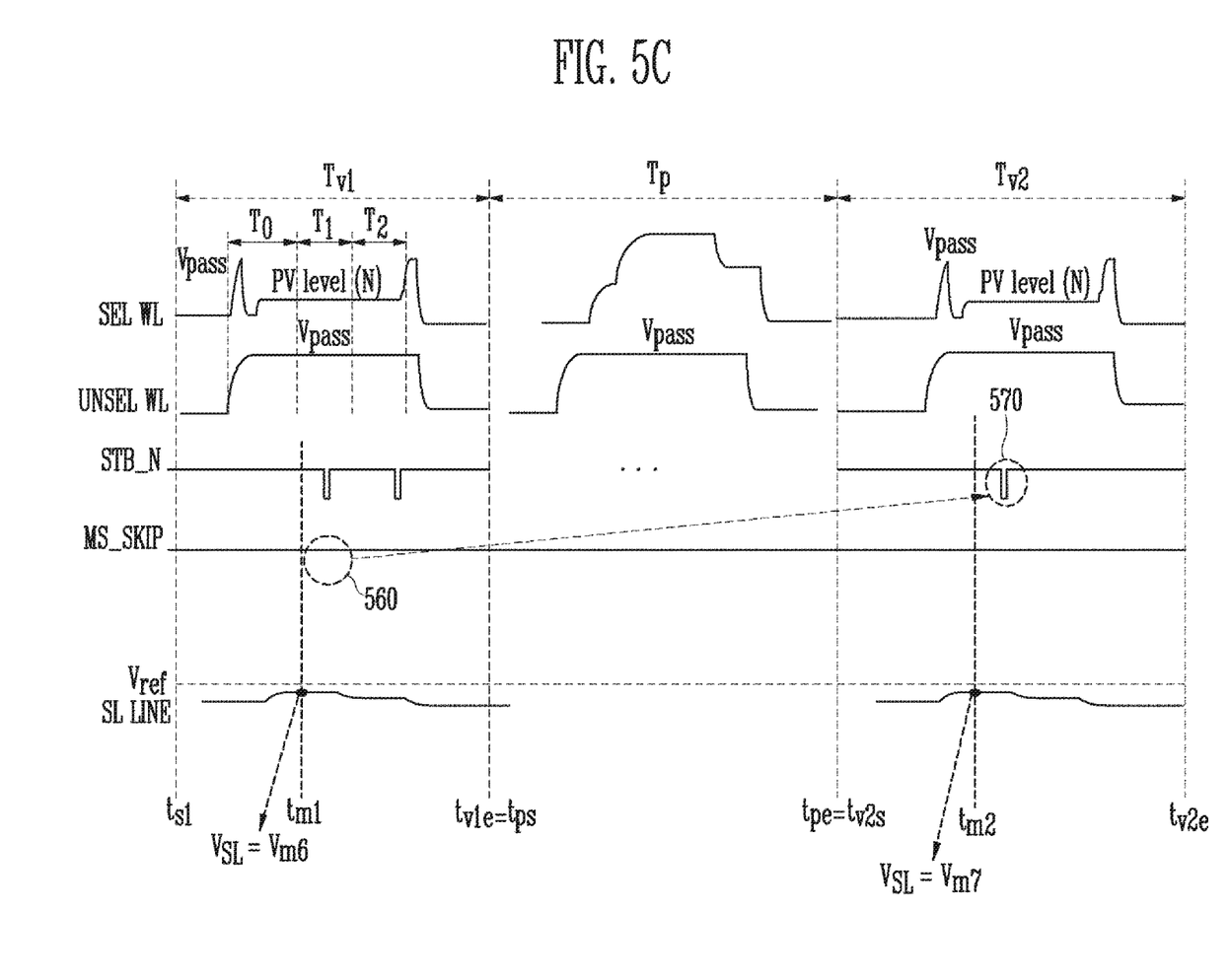

A program operation is performed between the first program verify operation and the subsequent program verify operation, in a period $T_p$ as shown in FIGS. 5A-5C.

A circuit for performing the operation according to the second embodiment may output a skip signal MS_SKIP which is generated from a suitable circuit comparing the measured voltage $V_{m3}$ and the reference voltage $V_{ref}$ and is provided to a microcontroller of the memory. In FIG. 5A, since the measured voltage $V_{m3}$ is greater than the reference voltage $V_{ref}$ in the first program verify operation, the skip signal MS_SKIP is conventionally set as a low level, as shown in the dashed circle 510.

As previously, a strobe signal STB_N is a signal inputted to the page buffer to indicate the time when the result of the sensing operation is latched in a corresponding sensing latch of the page buffer. Also, in the second embodiment, the result of the sensing operation is latched when the strobe signal STB_N transits to a low level.

When it is determined that the subsequent program verify operations is a multi-sensing operation for the program verify voltage PV level (N) (step S460 in FIG. 4), a subsequent program verify operation for the same program verify voltage PV level (N) is carried out as a multi-sensing operation, as shown in FIG. 5A. In particular, as shown in FIG. 4 by the feedback arrow between step 460 and step 400, in case that a multi-sensing operation is required, the testing of the source line voltage level is repeated at the following program verify operation with a same PV level until a single sensing is allowed.

In particular, as indicated in FIG. 5A, the period $T_{v2}$ of a second program verify operation, beginning with a first sensing operation of the subsequent program verify operations, is shown. Two sensing operations 520 and 530 are performed in the subsequent program verify operation, regardless whether the voltage $V_{SL}$ of the source line SL LINE is greater than the reference voltage $V_{ref}$ or not at a predetermined measurement time $t_{m2}$ of the subsequent program verify operation.

The predetermined measurement time $t_{m1}$ at which the measurement of the voltage $V_{SL}$ of the relevant source line SL LINE ($V_{SL}=V_{m3}$) is carried out may be at any point of time between the start time of the first sensing operation (indicated as $t_{s1}$ in FIG. 5A) and the start time of the strobe operation, i.e., the transition to a low level of the strobe signal STB_N (indicated as $t_{STB}$ in FIG. 5A), but the embodiment is not limited thereto.

In particular, in FIG. 5A, it is indicated that the voltage $V_{SL}$ of the source line SL LINE as measured at a further predetermined measurement time $t_{m2}$ of the subsequent program verify operation during the period $T_{v2}$ ($V_{SL}=V_{m4}$) is not greater than the reference voltage $V_{ref}$.

FIG. 5B depicts an example when a multi-sensing operation is performed as the subsequent program verify operation at S460 of FIG. 4. FIG. 5B is different from FIG. 5A in that the voltage $V_{SL}$ of the source line SL LINE is greater than the reference voltage $V_{ref}$ at a further predetermined measurement time $t_{m2}$ of the second program verify operation ($V_{SL}=V_{m5}$), which is shown at the dashed circle 540. The second program verify operation is thus a multi-sensing operation as it has been established in the first program verify operation, at step S460 of FIG. 4.

The voltage $V_{SL}$ of the source line SL LINE as measured in the subsequent program verify operations does not affect the decision already made, i.e., whether a single-sensing or a multi-sensing operation should be performed as the subsequent program verify operations. In particular, the comparison performed between the source line SL LINE and the reference voltage Vref during the period $T_{v2}$ as shown in FIG. 5A, in fact, does not reflect on a current sensing operation, but affects the next sensing operations which will be all single sensing operations.

FIG. 5C depicts an example when a single-sensing is performed as the subsequent program verify operation at S450 shown in FIG. 4. The whole program verify operation has been explained in connection with FIG. 5A, thus a repeated explanation will be omitted for sake of brevity.

In FIG. 5C, at a predetermined measurement time $t_{m1}$ of the first verify operation of the first program verify operation, during period $T_{v1}$, the voltage $V_{SL}$ of the relevant source line SL LINE is measured (step S410 of FIG. 4). The measured voltage $V_{m6}$ is compared with the reference voltage $V_{ref}$ (step S420 of FIG. 4). In FIG. 5C, the measured voltage $V_{m6}$ of the source line SL LINE ($V_{SL}=V_{m6}$) is not greater than the reference voltage $V_{ref}$. Therefore, the subsequent program verify operation is determined as a single-sensing operation (step S450 of FIG. 4). Since the measured voltage $V_{m6}$ is not greater than the reference voltage $V_{ref}$ in the first program verify operation, the skip signal MS_SKIP is maintained as a high level, as shown in the dashed circle 560 of FIG. 5C.

When it is determined that the subsequent program verify operation is a single-sensing verify operation for the program verify voltage PV level (N) (step S450 of FIG. 4), subsequent program verify operations are carried out as single-sensing operations, as shown FIG. 5C in the dashed circle 570. In particular, such single-sensing operations comprises a single step of sensing with a target cells current level only, irrespective whether the voltage $V_{SL}$ of the source line SL LINE is greater or not than the reference voltage $V_{ref}$ at a further predetermined measurement time $t_{m2}$ of the subsequent program verify operation.

In particular, in FIG. 5C, it is indicated that the voltage $V_{SL}$ of the source line SL LINE as measured at the further predetermined measurement time $t_{m2}$ of the subsequent program verify operation ($V_{SL}=V_{m7}$) is not greater than the reference voltage $V_{ref}$.

It can be in fact verified that the source voltage is never higher than in previous sensing verify operation at a same PV level. Hence, the performed test is valid for a sensing verify operation at same PV level only and is repeated for each sensing verify operation until it becomes a single sensing operation. From that moment, the test is no more repeated for that sensing verify operation and PV level.

Figure 6:
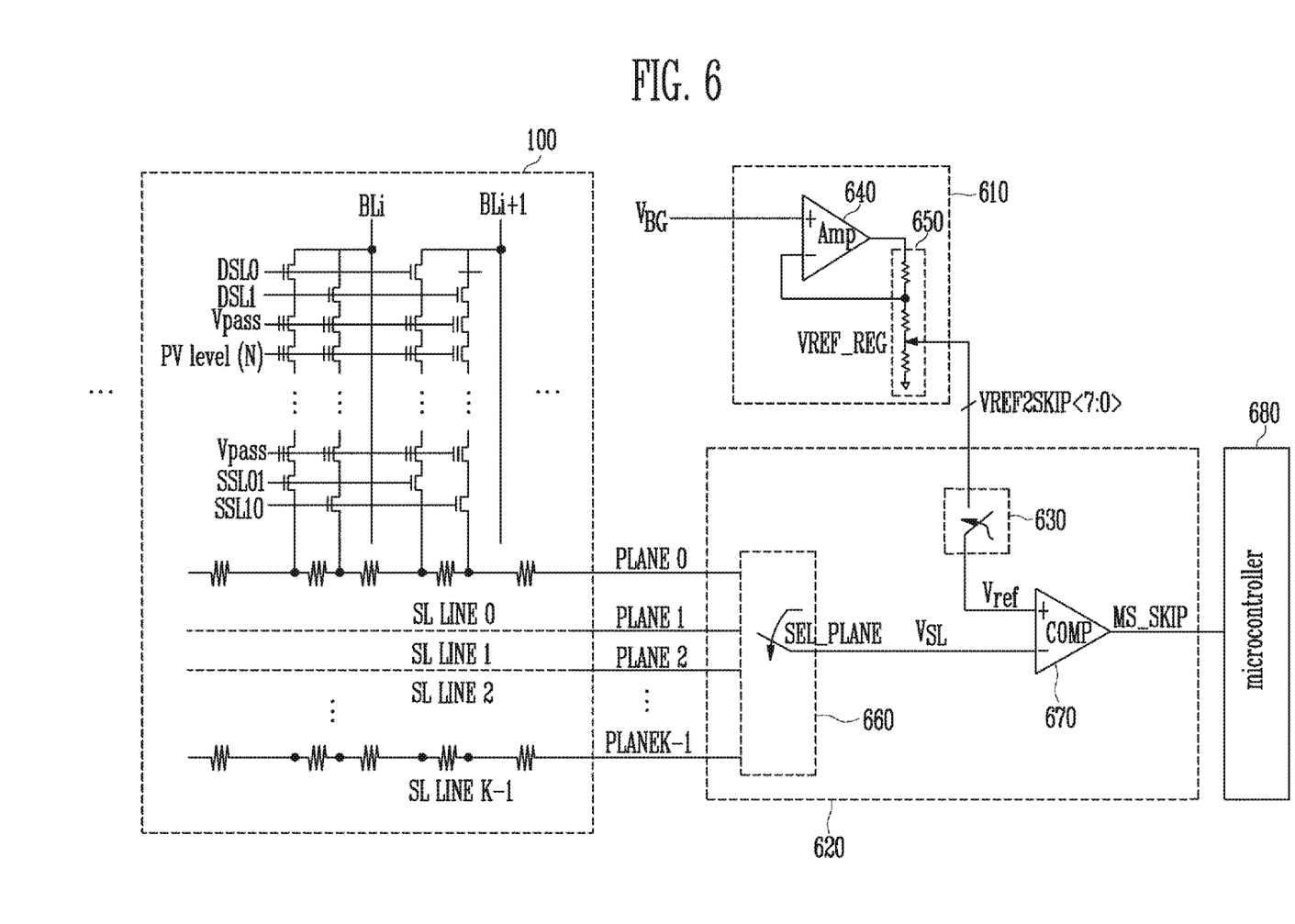
FIG. 6 shows an exemplary simplified circuit diagram for performing a program verify operation in accordance with the embodiments.

FIG. 6 shows an exemplary simplified circuit diagram for performing the method according to the embodiments as above described.

The circuit 620 comprises a comparator 670, e.g., an operational amplifier, arranged to compare a voltage $V_{SL}$ of the source line SL LINE of a memory cell array 100 of a non-volatile memory and a reference voltage $V_{ref}$. The comparator 670 is also arranged to output the result of the comparison as a skip signal MS_SKIP to a microcontroller 680 of the non-volatile memory. The circuit 620 may further comprise a first selection unit. The first selection unit may comprise a first multiplexer 660 to select a source line SL LINE which the strings including target cells are connected thereto, among a plurality of source lines SL LINEs 0~K−1.

In particular, reference is usually made of a memory array having K planes, as indicated in FIG. 6. Each plane of the memory cell array 100 may have only one source line SL LINE 0~K−1, as shown in FIG. 6, but the embodiment is not limited thereto.

The circuit 620 may also comprise a second selection unit. The second selection unit may comprise a second multiplexer 630 to select a reference voltage $V_{ref}$ among a plurality of reference voltages. For each program verify voltage, i.e. PV level (N), one reference voltage can be assigned to. VREF2SKIP<7:0> in FIG. 6 indicates that there are eight lines providing eight reference voltages, for instance by means of corresponding voltage regulators, to the second multiplexer 630.

In particular, a reference voltage $V_{ref}$ can be provided by a voltage regulator 610 as depicted in FIG. 6. It is underlined that the voltage regulator can be implemented in many different ways, and FIG. 6 shows just an example. The voltage regulator 610 may comprise an operational amplifier 640 whose non-inverting input is connected to a bias voltage $V_{BG}$, while the inverting input thereof is connected to a central node of a variable resistive divider 650 inserted between an output of the operational amplifier 640 and ground. The reference voltage $V_{ref}$ can be determined by adjusting a variable resistor inserted into such a variable resistive divider 650 and suitably providing a reference regulation voltage VREF_REG to the operational amplifier 640.

As previously indicated, the skip signal MS_SKIP is used by the microcontroller 680 of the non-volatile memory in order to skip or not to skip the second sensing operation in each program verify operation of different program verify voltages, or to establish that the program verify operations subsequent to a first multi-sensing program verify operation of a same program verify voltage are single or multi-sensing operations.

Figure 7:
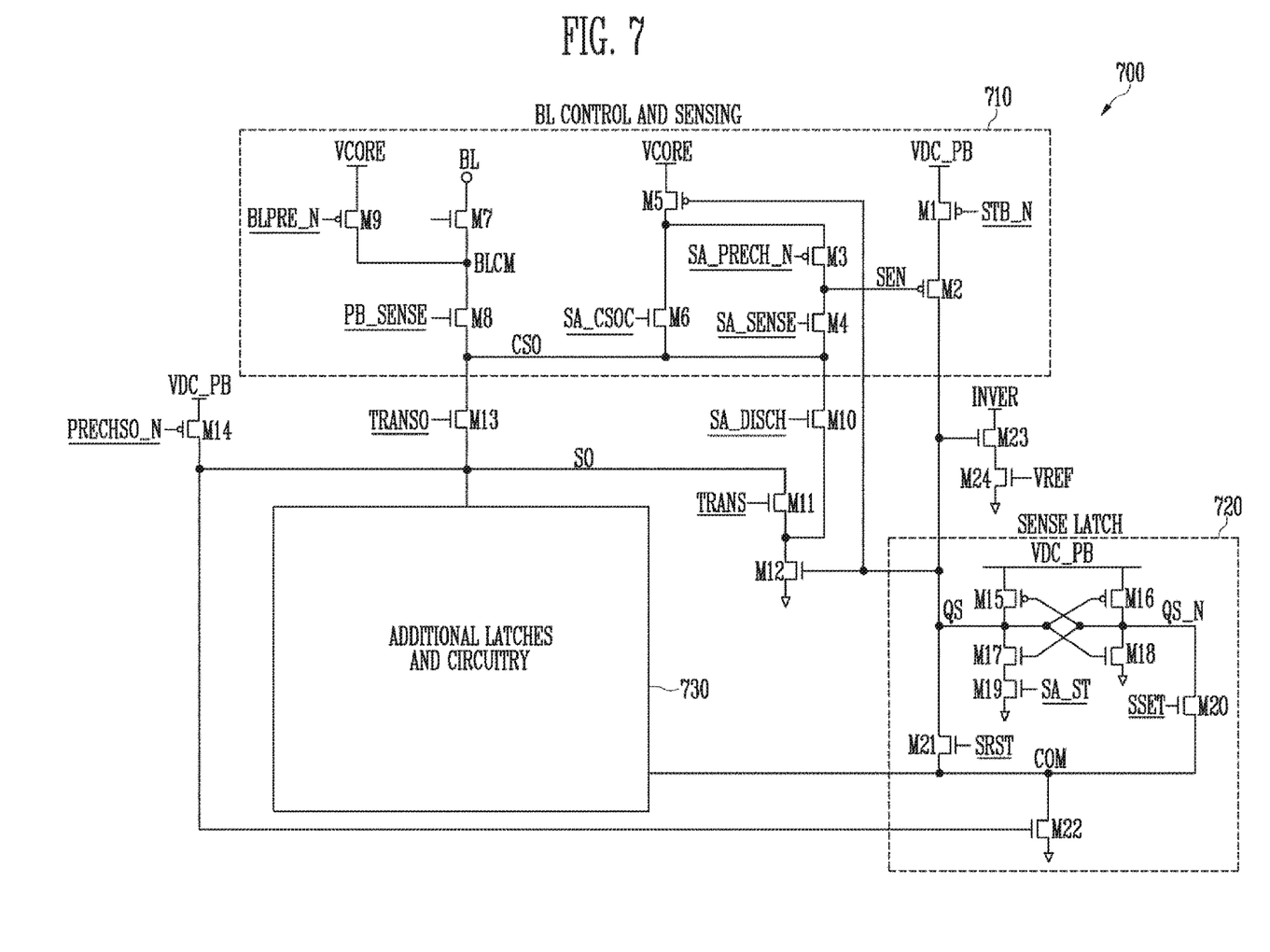
FIG. 7 shows an exemplary page buffer receiving a strobe signal in accordance with an embodiment.

FIG. 7 shows an exemplary page buffer 700 receiving the strobe signal STB_N. It should be remarked that configuration of the shown page buffer 700 is given only by way of explanation and the present invention should not be limited thereto.

In particular, the page buffer 700 comprises a BL control and sensing circuit 710 receiving the strobe signal STB_N at a gate terminal of a transistor M1, which is connected, through a transistor M2, to a sense latch 720. The transistor M1 may transfer a page voltage VDC_PB to the transistor M2. The page buffer 700 further comprises a plurality of transistors M3-M6. A transistor M3 may transfer a precharge voltage to the sensing node SEN in response to a signal SA_PRECH_N. The precharge voltage may be applied to the transistor M3 when the transistor M5 is turned on. The transistor M5 may be coupled between a voltage terminal VCORE and the transistor M3. The transistor M4 may be coupled between the transistor M3 and a node CSO. The transistor M6 may be coupled between the transistor M5 and the node CSO. The transistor M6 may be operated in response to a signal SA_CSOC.

The BL control and sensing circuit 710 further comprises a transistor M7 coupled to a bit-line BL and a transistor M8 coupled between the transistor M7 and the node CSO. The transistor M8 may be operated in response to a signal PB_SENSE. Accordingly, the bit-line BL is coupled to the node CSO when the transistors M7 and M8 are turned on. The BL control and sensing circuit 710 further comprises a transistor M9 to precharge a node BLCM which couples the transistors M7 and M8. The transistor M9 may be coupled between the terminal VCORE and the node BLCM, and may by turned on to precharge the bit-line BL through the node BLCM. The BL control and sensing circuit 710 is also connected to the additional latches and circuitry of the page buffer, globally indicated with an additional latches and circuitry 730, by means of further transistors M10, M11, M12 and M13.

Moreover, the page buffer 700 further comprises at least a transistor M14, duly connected to the sense latch 720, in particular to a transistor M22 thereof. The sense latch 720 further comprises a plurality of transistors M15-M19. The transistors M15-M18 may transfer the page voltage VDC_PB to a data node QS. The transistors M15, M17 and M19 are coupled between a node to which the page voltage VDC_PB and a ground terminal are also coupled. The transistors M15 and M17 may be configured to an inverter, and the transistors M16 and M18 may be configured to another inverter. The transistor M19 may be coupled to the ground terminal and operated in response to a signal SA_ST. The transistor M20 may be coupled between an inverted data node QS_N which is coupled between the transistors M16 and M18 and a common node COM. The transistor M20 may be operated in response to a set up signal SSET. The transistor M21 may be coupled between the data node QS and the common node COM. The transistor M21 may be operated in response to a reset signal SRST. The transistor M22 may discharge the common node COM in response a voltage of a node SO. The node SO may be coupled to the transistors M11, M13, M14 and the additional latches and circuitry 730.

The embodiments allow to save recovery time needed by a second sensing in a multi-sensing operation of a program verify operation, or the sensing time for a first rough sensing able to exclude deeply erased cells in program verify operations following a first multi-sensing program verify operation, thereby the whole program verify time can be reduced. Better configuration can be achieved adaptively due to reduced characterization effort. It is also possible to track the life cell current and the source bouncing as a function of the cycling, thereby a balance between improved speed and endurance can be achieved.

Moreover, the above explained embodiments can be adopted in a read operation of the non-volatile memory in order to reduce the global reading time.

This is the case shown in FIG. 3A where the second sensing operation can be skipped or not depending on source voltage value. The only difference with respect to the above described program verify operation is that instead of a PV level on a selected wordline WL, a read level will be applied. More precisely in a real read (and program verify) operation more readings will be applied to different SEL WL levels before the corresponding wordline is discharged.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for performing a plurality of program verify operations of a non-volatile memory, each program verify operation including at least one sensing operation, the method comprising:
performing a first program verify operation with first and second sensing operations of target cells of the non-volatile memory;
storing a result of a comparison between a voltage of a source line associated with the target cells and a reference voltage; and
performing a second program verify operation according to the result of the comparison,
wherein a number of sensing operations performed at the second program verify operation is determined based on the result of the comparison,
wherein the performing the first program verify operation comprises:
performing the first sensing operation for the target cells; and
performing the second sensing operation for memory cells excluding memory cells which are sensed in an erase state in the first sensing operation among the target cells.

2. The method of claim 1, wherein the performing the first program verify operation comprises applying a program verify voltage to gates of the target cells of the non-volatile memory during the first sensing operation and the second sensing operation.

3. The method of claim 1, wherein the target cells are programmed to a program state selected from a plurality of program states, and
wherein the first program verify operation and the second program verify operation are performed using a same program verify voltage corresponding to the program state.

4. The method of claim 1, wherein the storing the result of the comparison comprises storing a control signal generated by comparing the voltage of the source line with the reference voltage.

5. The method of claim 4, wherein the control signal is enabled if the voltage of the source line is lower than the reference voltage.

6. The method of claim 5, wherein the performing the second program verify operation comprises performing one sensing operation if the control signal is enabled.

7. The method of claim 4, wherein the control signal is disabled if the voltage of the source line is greater than the reference voltage.

8. The method of claim 7, wherein the performing the second program verify operation comprises performing two sensing operations if the control signal is disabled.

9. The method of claim 1, wherein the performing the second program verify operation comprises performing one sensing operation if the result of the comparison indicates that the voltage of the source line is lower than the reference voltage.

10. The method of claim 1, wherein the performing the second program verify operation comprises performing two sensing operations if the result of the comparison indicates that the voltage of the source line is greater than the reference voltage.

11. The method of claim 1, further comprising applying a plurality of program voltages to gates of the target cells prior to the performing the second program verify operation according to the result of the comparison.

12. A circuit for controlling a plurality of program verify operations of a non-volatile memory, each program verify operation including at least one sensing operation, circuit comprising:
a comparator configured to compare, at a first program verify operation, a voltage of a source line associated with target cells of the non-volatile memory and a reference voltage to output a result of the comparison; and
a microcontroller configured to control the non-volatile memory to perform the first program verify operation, store the result of the comparison and control the non-volatile memory to perform a second program verify operation according to the result of the comparison,
wherein a number of sensing operations performed at the second program verify operation is determined based on the result of the comparison, and
wherein the first program verify operation includes a first sensing operation for the target cells and a second sensing operation for memory cells excluding memory cells which are sensed in an erase state in the first sensing operation among the target cells.

13. The circuit of claim 12, wherein the microcontroller controls the non-volatile memory to perform, at the second program verify operation, two sensing operations if the voltage of the source line is greater than the reference voltage.

14. The circuit of claim 12, further comprising a voltage regulator coupled to an input of the comparator and providing the reference voltage.

15. The circuit of claim 14, wherein the voltage regulator comprises an operational amplifier providing the reference voltage by adjusting a variable resistor inserted into the variable resistive divider in response to an input connected to a central node of a variable resistive divider.

16. The circuit of claim 12, wherein the microcontroller controls the non-volatile memory to perform, at the second program verify operation, one sensing operation if the voltage of the source line is lower than the reference voltage.

17. The circuit of claim 12, wherein the first program verify operation and the second program verify operation are performed using a same program verify voltage.

* * * * *

UNITED STATES PATENT AND TRADEMARK OFFICE
CERTIFICATE OF CORRECTION

PATENT NO.         : 10,553,297 B2                                    Page 1 of 1
APPLICATION NO.    : 15/937994
DATED              : February 4, 2020
INVENTOR(S)        : Alessandro Sanasi et al.

It is certified that error appears in the above-identified patent and that said Letters Patent is hereby corrected as shown below:

On the Title Page

Item (30), should read:
(30) Foreign Application Priority Data: Mar. 29, 2017 (IT) ............102017000034719

Signed and Sealed this
Twenty-fourth Day of March, 2020

Andrei Iancu
*Director of the United States Patent and Trademark Office*